(12) United States Patent
Mai

(10) Patent No.: US 7,631,211 B1
(45) Date of Patent: Dec. 8, 2009

(54) SHARING ELEMENTS IN MULTIPLE DATA-RATE I/O

(75) Inventor: Kevin W. Mai, San Jose, CA (US)

(73) Assignee: Altera Corporation, San Jose, CA (US)

(*) Notice: Subject to any disclaimer, the term of this patent is extended or adjusted under 35 U.S.C. 154(b) by 527 days.

(21) Appl. No.: 11/476,341

(22) Filed: Jun. 27, 2006

(51) Int. Cl.
*G06F 1/00* (2006.01)

(52) U.S. Cl. ............................ 713/500; 326/40; 326/41; 326/46

(58) Field of Classification Search .................. 713/500; 326/40, 41, 46
See application file for complete search history.

(56) References Cited

U.S. PATENT DOCUMENTS

| | | | | |
|---|---|---|---|---|
| 6,020,760 A | * | 2/2000 | Sample et al. | 326/41 |
| 6,452,417 B1 | * | 9/2002 | Moore | 326/41 |
| 6,472,904 B2 | * | 10/2002 | Andrews et al. | 326/38 |
| 6,674,303 B1 | * | 1/2004 | Morse et al. | 326/41 |
| 6,816,991 B2 | * | 11/2004 | Sanghani | 714/733 |
| 6,952,115 B1 | * | 10/2005 | Andrews et al. | 326/46 |
| 6,980,028 B1 | * | 12/2005 | Plants et al. | 326/40 |
| 7,098,690 B2 | * | 8/2006 | Nguyen et al. | 326/46 |
| 7,330,051 B1 | * | 2/2008 | Huang et al. | 326/38 |
| 2004/0095178 A1 | * | 5/2004 | Bang et al. | 327/215 |
| 2006/0087341 A1 | * | 4/2006 | Plants et al. | 326/40 |

* cited by examiner

*Primary Examiner*—Thomas Lee
*Assistant Examiner*—Vincent T Tran
(74) *Attorney, Agent, or Firm*—Townsend and Townsend and Crew LLP; David B. Raczkowski

(57) ABSTRACT

Circuits, methods, and apparatus are directed to sharing input and output functionality. A timing circuit usable for input and output functionality may be combined with another timing circuit to provide additional input/output functionality or to reduce the number of circuit elements for input/output functionality. For example, two timing circuits may be used to provide double data-rate input while still providing output functionality, or vice versa. Two timing circuits may also provide output that is timed and gated with an output enable signal.

21 Claims, 7 Drawing Sheets

SHARING ELEMENTS IN MULTIPLE DATA-RATE I/O

BACKGROUND

The present invention relates to input/output (I/O) interfaces and more particularly to sharing resources between input and output functions.

Due to rapid progress in design techniques and process technology, the speed of integrated circuit (IC) devices has increased considerably. Such a rapid change in the speed of IC devices has also led to increasingly demanding requirements on the memory devices that interface with these IC's. Besides having a high storage capacity, modern memory chips must be able to interface with other chips at increasingly faster speeds. Consequently, the use of Double Data-Rate (DDR) and Quadruple Data-Rate (QDR) memory devices, or more generally a multiple data-rate interface, has become increasingly common. A DDR interface is a synchronous (that is, clocked) interface where data is transferred on each edge of a clock signal. Specifically, alternating data bits in a DDR signal are transferred on the rising and falling edges of a clock signal, thereby doubling the peak throughput of the memory device without increasing the system clock frequency. Similar steps and results exist for Low Voltage Differential Signaling (LVDS).

In order to transmit these higher data-rate signals, additional circuitry is needed as compared to the circuitry needed for single data-rate (SDR) I/O. Additional circuitry may also be needed to ensure accurate data transfers during SDR I/O with increased clock frequency or during multiple data-rate I/O.

Also, to provide varying data transfer rates, an I/O element typically has sufficient circuitry dedicated to input and sufficient circuitry dedicated to output. Unfortunately, this capability adds more circuit elements and wires, and thus more area and cost.

Thus, what are needed are circuits, methods, and apparatus for providing the flexibility of multiple I/O configurations including multiple data-rate options while using a minimal amount of additional area and cost.

SUMMARY

Accordingly, embodiments of the present invention provide circuits, methods, and apparatus directed to providing multiple I/O configurations including multiple data-rate options while using a minimal amount of additional area and cost. One exemplary embodiment of the present invention provides this by sharing input and output functionality. In one embodiment, a register in the input path is used in double data-rate output. In another embodiment, a register in the input path is used as an output-enable register. In yet another embodiment, a register in the output path is used in double-date input.

In one exemplary embodiment of the present invention, an integrated circuit has a first timing circuit and a selection circuit having an output coupled with an input of the first timing circuit. The selection circuit receives a first input data signal and a first output data signal. During an input function, the selection circuit sends the first input data signal to the first timing circuit. During an output function, the selection circuit sends the first output data signal to the first timing circuit. The integrated circuit also has a second timing circuit. The first and second timing circuits are capable of being used together to perform at least one multiple data-rate input or output function. The multiple data-rate may be a double data-rate, a quadruple data-rate, or some other multiple.

The integrated circuit may also have a control signal line coupled with the selection circuit, such that the control signal determines whether the first timing circuit is used for input or output. The control signal may be obtained partially or wholly from a value stored in a memory element. The integrated circuit may also have a third timing circuit having an input or an output coupled with the first timing circuit. The third timing circuit may be used to provide same edge I/O. The timing circuits may be registers.

One or more other selection circuits may have an output coupled with the first timing circuit. In one embodiment, the other selection circuit is also coupled with a signal line and a clock enable line capable of carrying a first clock enable signal. The signal line is capable of carrying a data signal or a second clock enable signal. In another embodiment, another selection circuit receives a clock signal and a delayed or inverted clock signal.

The integrated circuit may also have a selection circuit coupled with an output of the first timing circuit and coupled with an output of the second timing circuit for performing a multiple data-rate output function. In a circuit capable of multiple data-rate output, the circuit may also be capable of multiple data-rate input, and vice versa. In one embodiment, another selection circuit has an output coupled with an input of the second timing circuit. This selection circuit may receive a second input data signal and a second output data signal. During an input function, this selection circuit may send the second input data signal to the second timing circuit. During an output function, this selection circuit may send the second output data signal to the second timing circuit. During a multiple data-rate input, a third timing circuit may receive the first input data signal from the first timing circuit, and a fourth timing circuit may receive the second input data signal from the second timing circuit.

In another exemplary embodiment of the present invention, a method provides for a multiple data-rate input or output function. The method selects a first data signal from an input data signal and an output data signal for sending to a first timing circuit; receives the first data signal at the first timing circuit; outputs the first data signal from the first timing circuit; outputs a second data signal from a second timing circuit; and utilizes the first and second data signals to produce at least one multiple data-rate input or output. At a point before or after being received at the first timing circuit, the first data signal may be received at a third timing circuit and output from the third timing circuit.

In an embodiment where the first data signal is the first output data signal, the method may also receive the first output data signal at a selection circuit; receive the second data signal at the selection circuit; and select among the first data signal and second data signal for output. The method may also select a third data signal from a second input data signal and a second output data signal for sending to the second timing circuit; receive the third data at the second timing circuit; output the third data from the second timing circuit; and output a fourth data signal from the first timing circuit. The third and fourth data signals may comprise a multiple data-rate input.

The method may send the input data signal or the output data signal along a signal line that is coupled with an input of another selection circuit. In this embodiment, an output of this selection circuit is coupled with a clock enable input of the first timing circuit. The method may also include receiving a clock enable signal at an input of this selection circuit;

and selecting with this selection circuit to send the clock enable signal to the first timing circuit.

In one embodiment, the method includes selecting with a selection circuit an input clock enable signal or a output clock enable signal to send to a clock enable input of the first timing circuit. In another embodiment, a third data signal is output from a third timing circuit to the first selection circuit. The third data signal may be the first input data signal or the first output data signal. The third timing circuit may be used to align the first and second data signals.

In another exemplary embodiment of the present invention, an integrated circuit has a first timing circuit and a first selection circuit having an output coupled with an input of the first timing circuit. The first selection circuit receives an input data signal and an output data signal and outputs one of the data signals to the first timing circuit. The integrated circuit also has a second timing circuit and an output circuit having inputs coupled with an output of the first timing circuit and an output of the second timing circuit.

In one embodiment, the output circuit may be a second selection circuit that selects a signal from among its inputs, which may be coupled to other timing circuits, for outputting. In another embodiment, the output circuit is an output buffer, and the output of the first timing circuit determines if the output of the second timing circuit will be output. The circuit may have another timing circuit having an input or an output coupled with the first timing circuit. The circuit may also have another timing circuit having an output coupled with the output circuit with the output of two of timing circuits providing multiple data-rate output functionality.

A better understanding of the nature and advantages of the present invention may be gained with reference to the following detailed description and the accompanying drawings.

DESCRIPTION OF EXEMPLARY EMBODIMENTS

Embodiments of the present invention are directed to input/output (I/O) circuits used, for example, to transmit data to and receive data from a memory chip at multiple data-rates, as well as internal signals used in I/O. The data may be produced or received by a programmable logic device (PLD), such as field programmable gate arrays (FPGA), or by non-programmable devices. The circuits may also be used for low voltage differential signaling (LVDS) and clock outputs generation.

Figure 1:
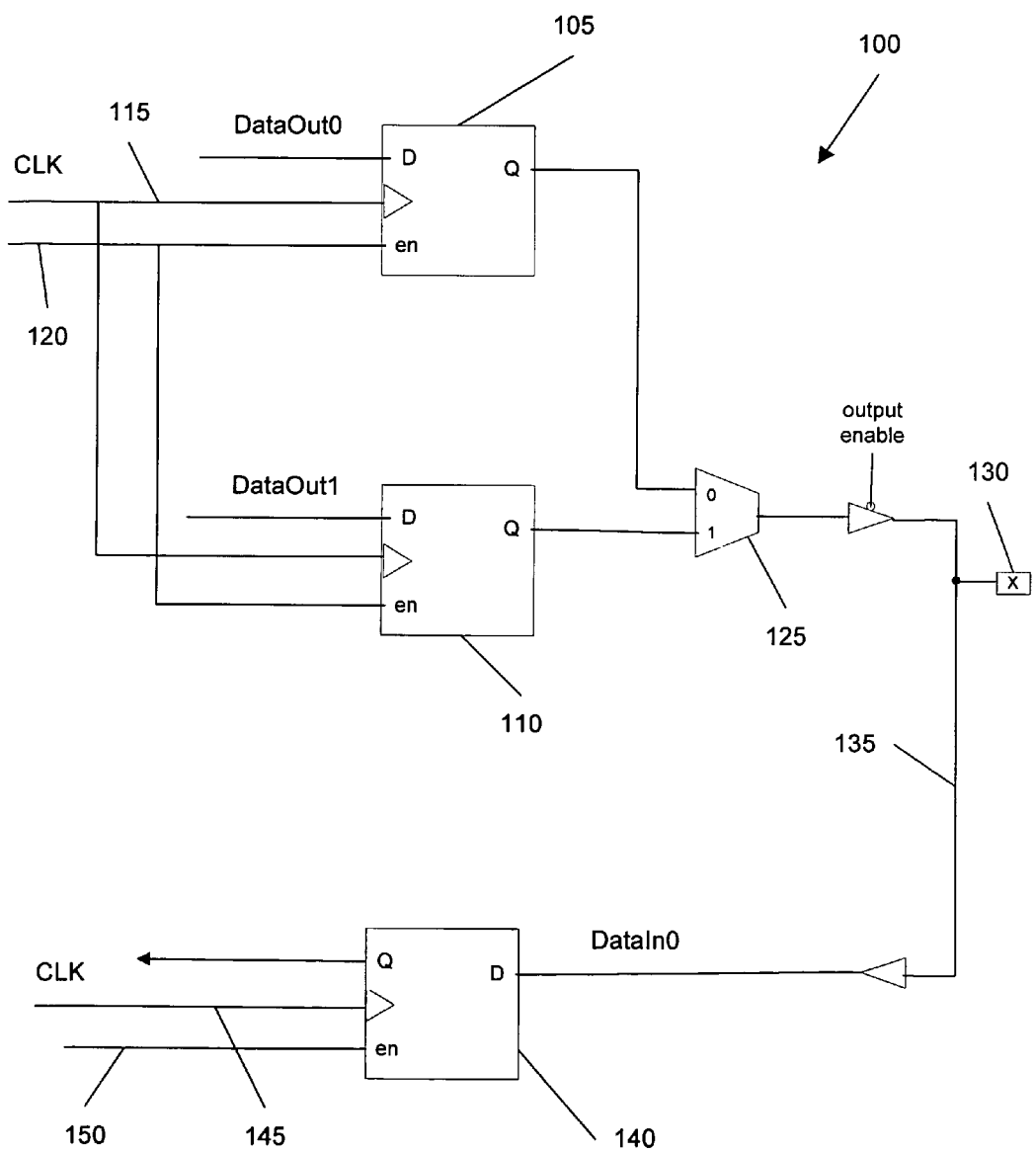
FIG. 1 illustrates a schematic of an input/output cell that is improved by incorporating an embodiment of the present invention.

FIG. 1 is a schematic of an I/O cell 100 that can send data to and receive data from a device, such as a memory, a processor, or other integrated circuit, and that is improved by incorporating an embodiment of the present invention. The two output registers 105 and 110 combine to provide DDR output functionality. Register 105 receives DataOut0, and register 110 receives DataOut1. The registers 105 and 110 receive clock (CLK) and output clock enable signals on lines 115 and 120 respectively.

Selection circuit 125 receives the output of the signals from output registers 105 and 110 and selects one of them for output twice during a cycle, e.g. on each edge of a signal. Register 110, which is not used for SDR operation, may be a level sensitive latch that is not edge-triggered. When the output enable signal has the proper value, the output is sent to I/O pad 130. If only single data-rate output is desired, the output of register 105 may always be selected by selection circuit 125 during an output.

I/O data cell 100 is also capable of single data-rate input. While output is not enabled, an input data signal DataIn0 travels on line 135 to input register 140. Register 140 receives clock and input clock enable signals on lines 145 and 150 respectively. A clock enable signal may be used, for example, to turn off a register so that it does not operate when receiving a clock edge. Thus, to provide the options of having single data input and output, and double data-rate output, I/O cell 100 uses 3 data registers.

Figure 2:
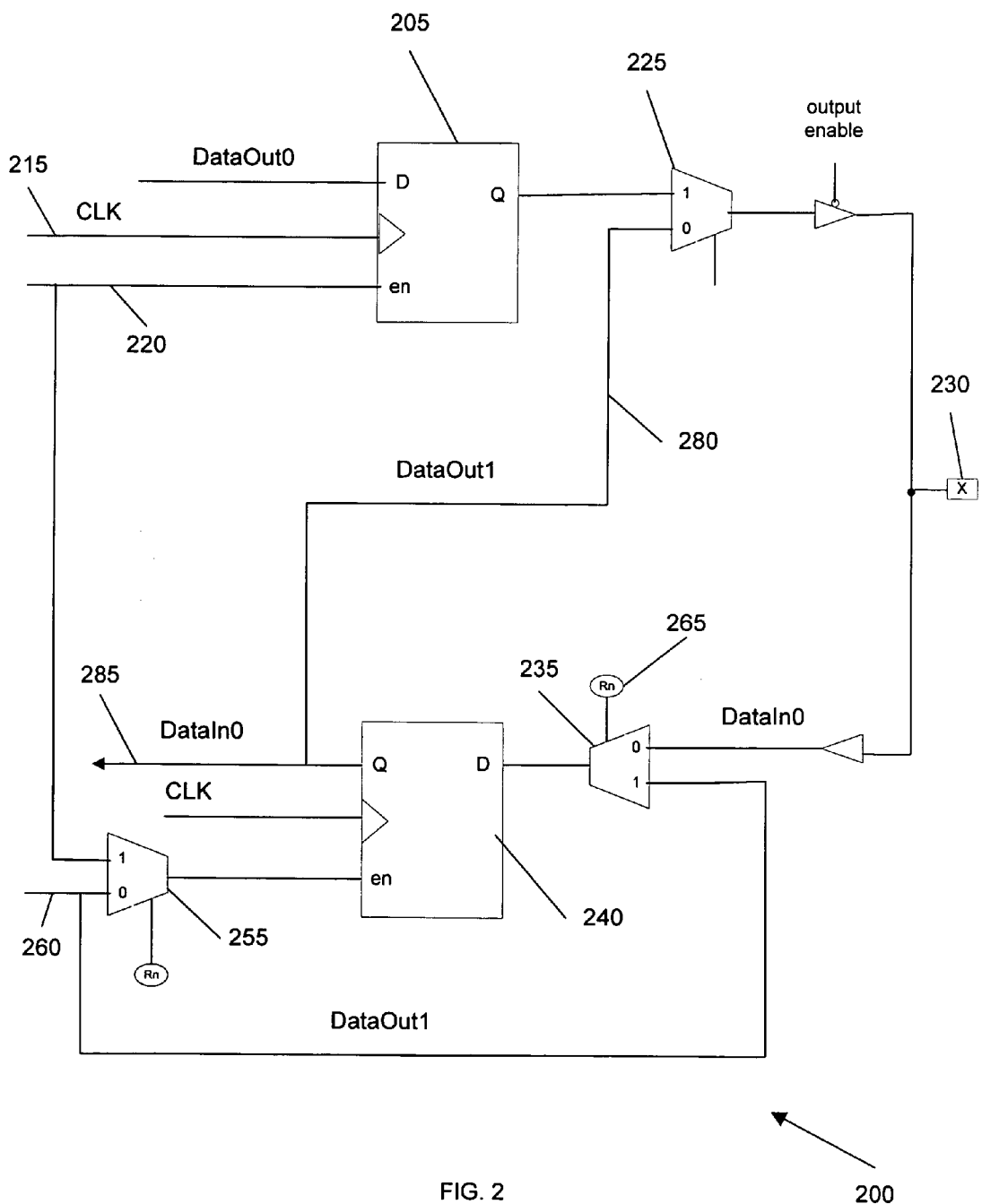
FIG. 2 illustrates a schematic of an input/output cell including a register for use as an input register or for use as an output register in a DDR output according to an embodiment of the present invention.

FIG. 2 is a schematic of an I/O cell 200 according to an embodiment of the present invention. I/O cell 200 provides the same I/O options as cell 100. As register 240 is capable of being used as an input and an output register, I/O cell 200 uses less wires and one less register.

During a DDR output function, register 205 receives DataOut0, and clock and output clock enable signals on lines 215 and 220 respectively. DataOut1 is sent along line 260 to selection circuit 235, which chooses between DataOut1 and DataIn0 to send to register 240. During a DDR output, DataOut1 is chosen. Register 240 then sends DataOut1 on line 280 to selection circuit 225. Only half of register 240, e.g. the master latch, may be used during a multiple data-rate output.

Selection circuit 225 chooses between DataOut0 and DataOut1 to be output. Also, during a DDR output, selection circuit 255 selects the output clock enable on line 220 to be sent to the enable input of register 240. For SDR functionality, the output of register 205 may always be selected by selection circuit 225 during an output, e.g. by having the select signal to selection circuit 225 be a constant. For multiple-data-rate output operation, the select signal to selection circuit 225 can be the CLK signal.

During an SDR input function, selection circuit 235 chooses DataIn0 for sending to register 240. Register 240 then send DataIn0 on line 285 to the other parts of the circuit. In the input mode, selection circuit 255 chooses the input clock enable on line 260 to be sent to register 240. Note that during DDR output, line 260 carries DataOut1. This does not pose any problems during DDR output since the input clock enable is not needed.

I/O cell 200 may be configured to run in one either the DDR output function or SDR input function by setting the memory value in CRAM bit 265. SDR output is still compatible with either of these modes as I/O pad 230 may be bidirectional. Alternatively, the CRAM bits could be any type of memory device, such as flash memory, RAM, EPROM, EEPROM, registers, or other storage circuit. I/O cell 200 can also be configured to run in DDR output or SDR input at different times of operation by coupling selection circuits 235 and 255 with a varying control signal, instead of using a control signal from a value set in memory.

Registers 205 and 240 can be any general timing circuit that can be clocked, such as a latch, storage element, flip-flops, or FIFO device. The selection circuits may be a multiplexer or any general selection circuit composed of, for example, logic gates, tristate gates, pass gates, or pass devices. Also, the registers may be made to clock on a falling or leading edge, such as by use of any number of inverters, which are separate or incorporated into the registers.

Figure 3:
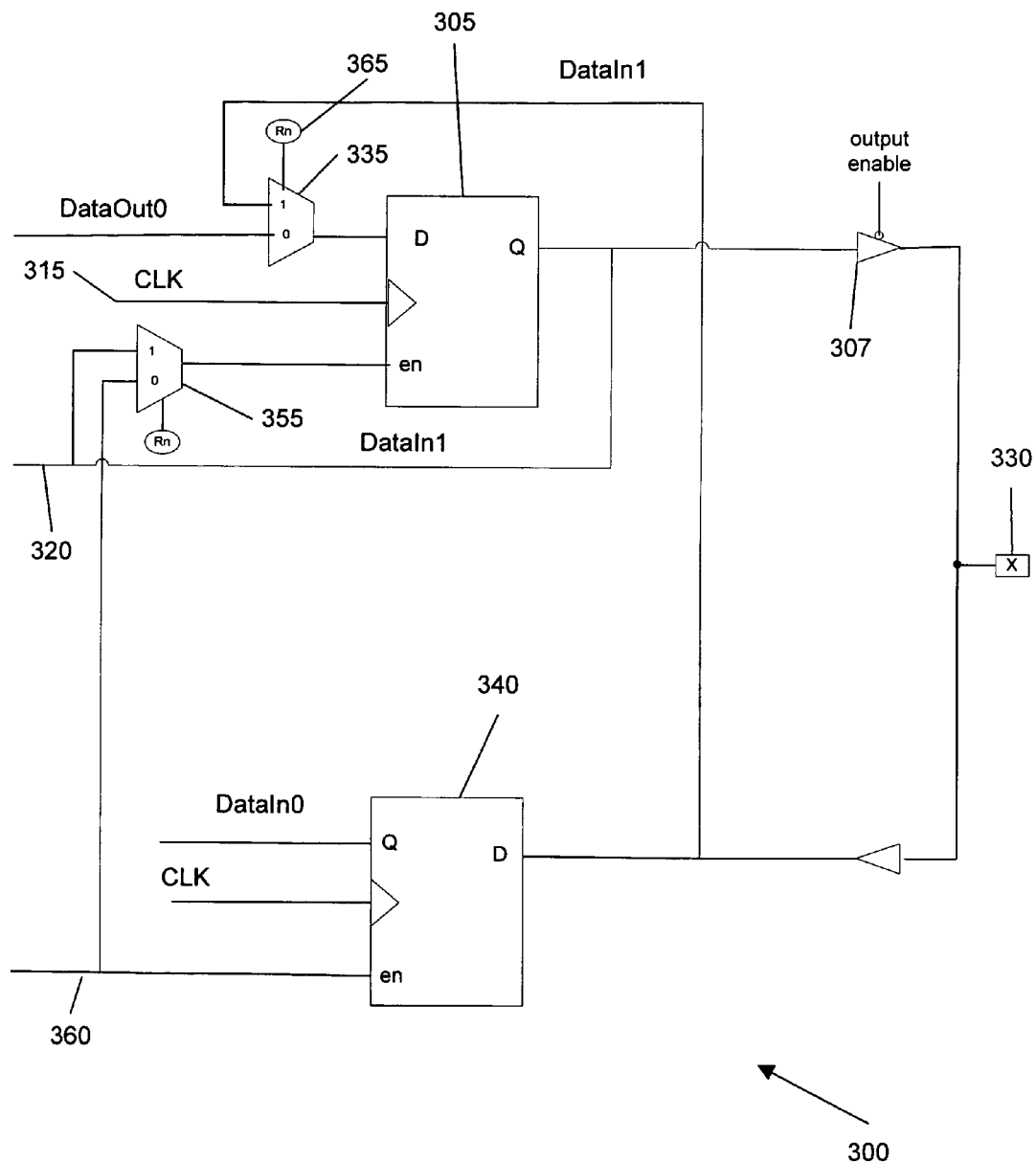
FIG. 3 illustrates a schematic of an input/output cell including a register for use as an output register or for use as an input register in a DDR input according to an embodiment of the present invention.

FIG. 3 is a schematic of an I/O cell 300 according to an embodiment of the present invention. I/O cell 300 provides DDR input, SDR input, and SDR output. Register 340 is dedicated to input while register 305 can be used for both input and output.

For DDR input, the DataIn0 is received by register 340 at one edge of a clock signal CLK, and DataIn1 is received by register 305 at another edge of the CLK signal. Selection circuit 335 receives DataIn1 and DataOut0 as input. DataIn1 is chosen for sending to register 305 during a DDR input function. The selection may be set by CRAM bit 365, whose signal may be static so that the selection stays the same or dynamic so that I/O cell 300 may change from DDR input to SDR output during operation. Register 305 outputs DataIn1 along line 320. During DDR input, selection circuit 355 chooses the input clock enable on line 360 to send to register 305. The SDR input functionality remains similar to that of I/O cell 100.

During an SDR output function, selection circuit 335 chooses DataOut0 for sending to register 305. Register 305 sends DataOut0 to output buffer 307. When the output enable signal has the proper value, DataOut0 is sent to I/O pad 330. In the output mode, selection circuit 355 chooses the output clock enable on line 320 to be sent to register 305. During DDR input, line 320 carries DataIn1. This does not pose any problems during DDR input since the output clock enable is not needed.

The embodiments of FIGS. 2 and 3 may be combined according to further embodiments of the present invention. The output capability of register 240 may be added to register 340, or the input capability of register 305 can be added to register 205. Thus, the I/O cell can have the options of DDR input and output as well as SDR input and output. One skilled in the art will recognize the many different embodiments in which registers 240 or 305 may be utilized to respectively facilitate an output or input function. For example, different flavors of DDR input and output, such as same edge modes or same edge pipelined modes, may be provided.

Figure 4:
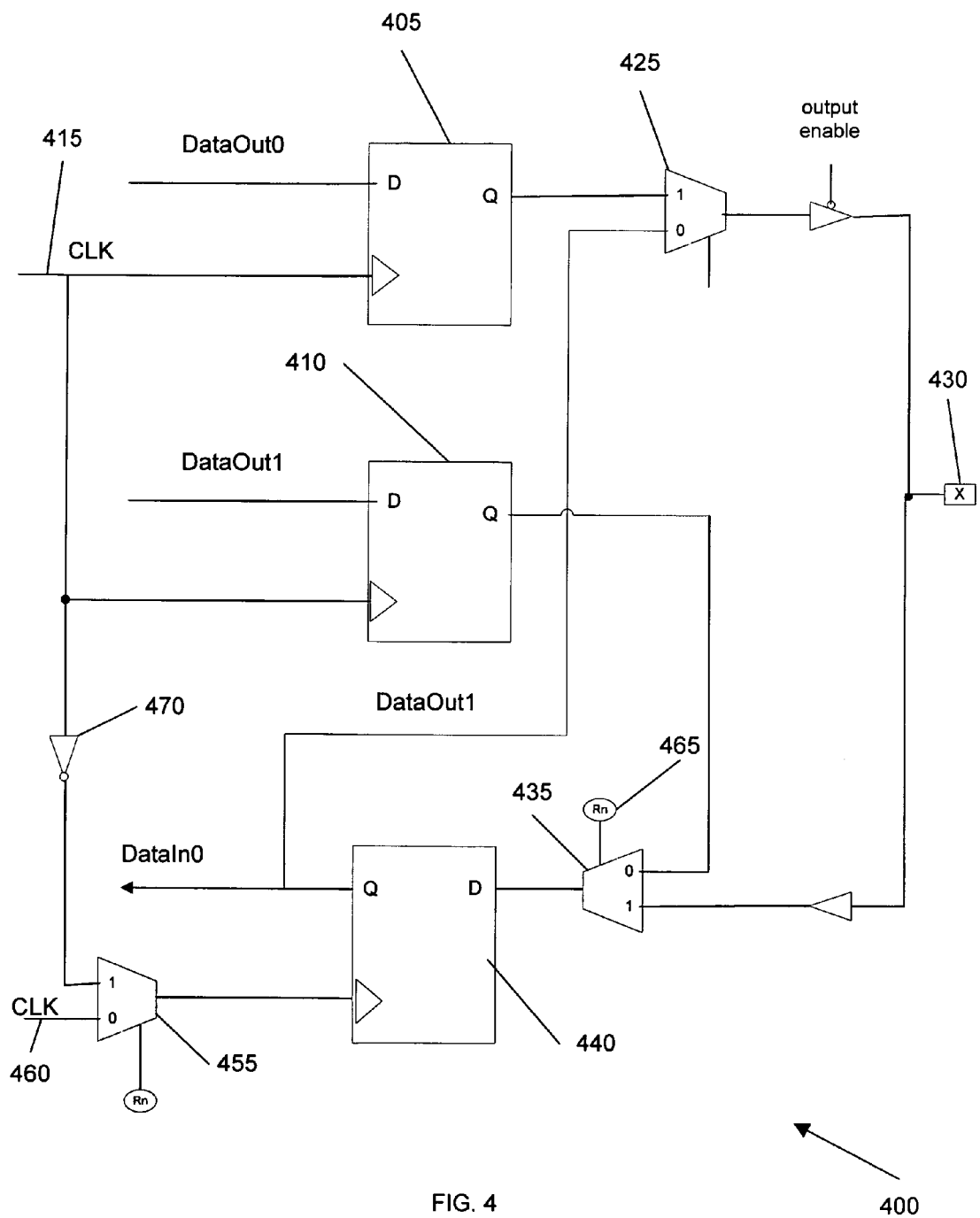
FIG. 4 illustrates a schematic of an input/output cell including a register for use as an input register or for use as an output register in a DDR output according to an embodiment of the present invention.

FIG. 4 is a schematic of an I/O cell 400 according to an embodiment of the present invention. I/O data cell 400 utilizes register 440 to provide same edge DDR output, i.e. data can be presented to I/O cell 400 on the same clock edge. Register 405 receives DataOut0, and register 410 receives DataOut1. Both registers receive clock signals on lines 415. A clock enable signal may also be sent to the registers.

Output from register 410 is sent to selection circuit 435. Selection circuit 435 chooses between DataOut1 and DataIn0 to send to register 440. During a DDR output function, DataOut1 is chosen. Register 440 then sends DataOut1 to selection circuit 425. Selection circuit 425 chooses between DataOut0 and DataOut1 to be output. The selection of a clock enable may still be performed as in I/O cell 200. In another embodiment, register 440 could receive DataOut1, as register 240 does. The output of register 440 could then be fed into register 410 to achieve the same edge DDR output.

During same edge DDR output, selection circuit 455 may select an inverted clock signal to be sent to register 440. In this manner, both DataOut0 and DataOut1 may be clocked on the same edge. In one embodiment, the inverted clock signal is accomplished by an inverter 470. The SDR output functionality remains similar to that of I/O cell 100. In some embodiments, selection circuit 455 and/or inverter 460 are optional. For example, the CLK signal on line 415 could be sent to line 460 via a programmable invert.

During an SDR input function, selection circuit 435 chooses DataIn0 for sending to register 440. Register 440 then send DataIn0 to the other parts of the circuit. In the input mode, selection circuit 455 may choose a clock signal on line 460 to be sent to register 440. The DataOut1 line may used for an input clock enable signal line to reduce the number of wires.

In one embodiment, I/O cell 400 may be capable also to perform a regular DDR output function using only two registers. For example, the DataOut1 signal from register 410 may bypass register 440 and be sent more directly to selection circuit 425. Another selection circuit may be used for this purpose.

In other embodiments, same edge DDR input may be provided. For example, output register 305 may be used to provide same edge DDR input. This can be accomplished in a similar fashion as same edge DDR output in I/O cell 400. Register 305 would receive the output from one of two DDR input registers. One or more inverters, possibly in conjunction with a selection circuit, may be used in a clock signal path to achieve the same edge DDR input. Additionally, another output register may receive the output from the second of the two DDR input registers to provide same edge pipelined input. These two output registers could be registers 405 and 410. Other embodiments may include other combinations with more or less registers, which share input and output functionality.

Figure 5:
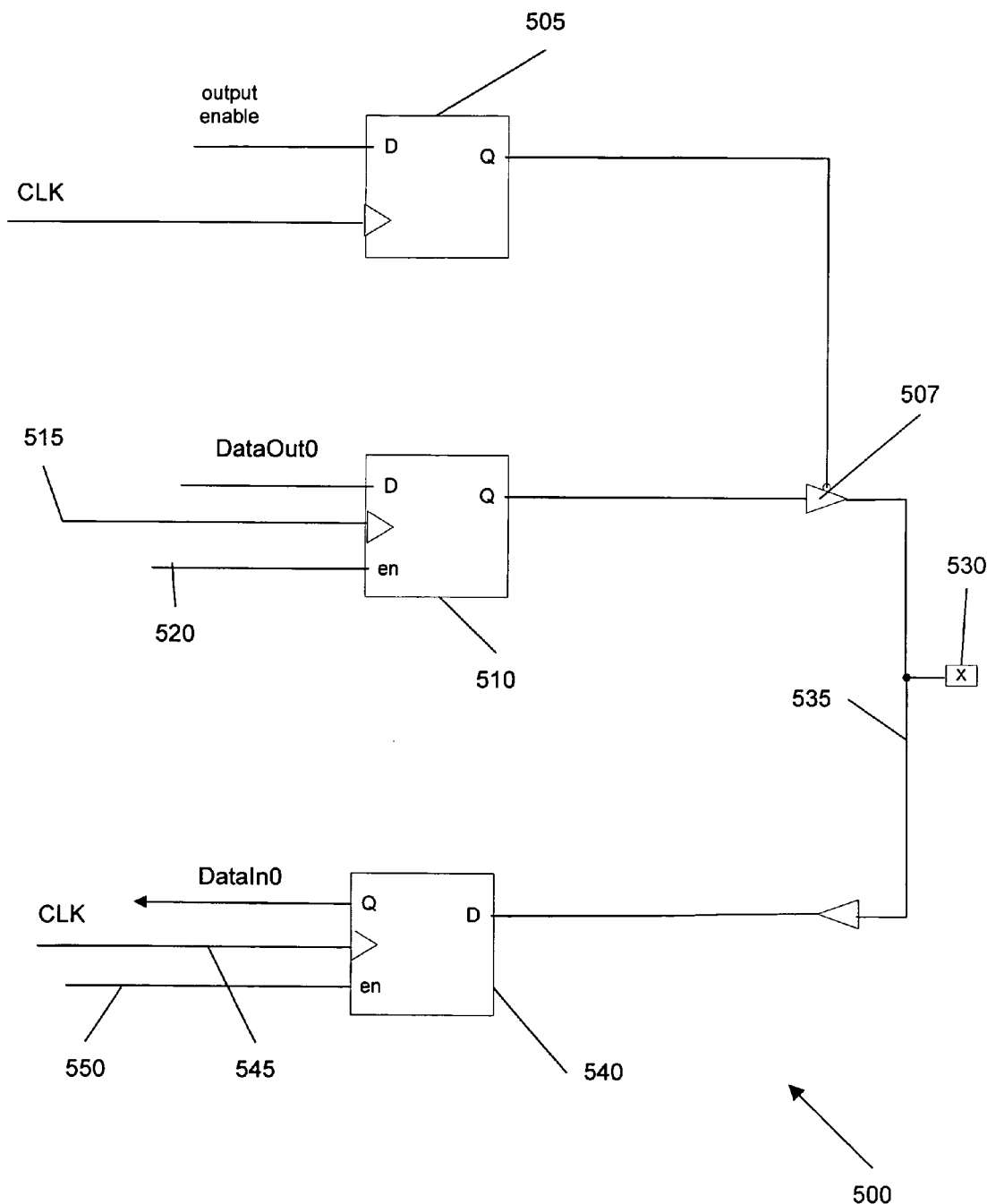
FIG. 5 is a schematic of input and output circuitry that is improved by incorporating an embodiment of the present invention.

FIG. 5 is a schematic of an I/O cell 500 that can send data to and receive data from a memory device and that is improved by incorporating an embodiment of the present invention. Output-enable register 505 and output register 510 combine to provide SDR output functionality. Register 505 receives the output enable signal, and register 510 receives DataOut0. Register 510 receives clock and clock enable signals on lines 515 and 520 respectively. Buffer 507 receives DataOut0 from registers 510, and the output enable signal from register 505. When the output enable has the proper value, the DataOut0 is sent to I/O pad 530.

I/O data cell 500 is also capable of single data-rate input. While output is not enabled, an input data signal DataIn0 travels on line 535 to input register 540. Register 540 receives clock and clock enable signals on lines 545 and 550 respectively.

Figure 6:
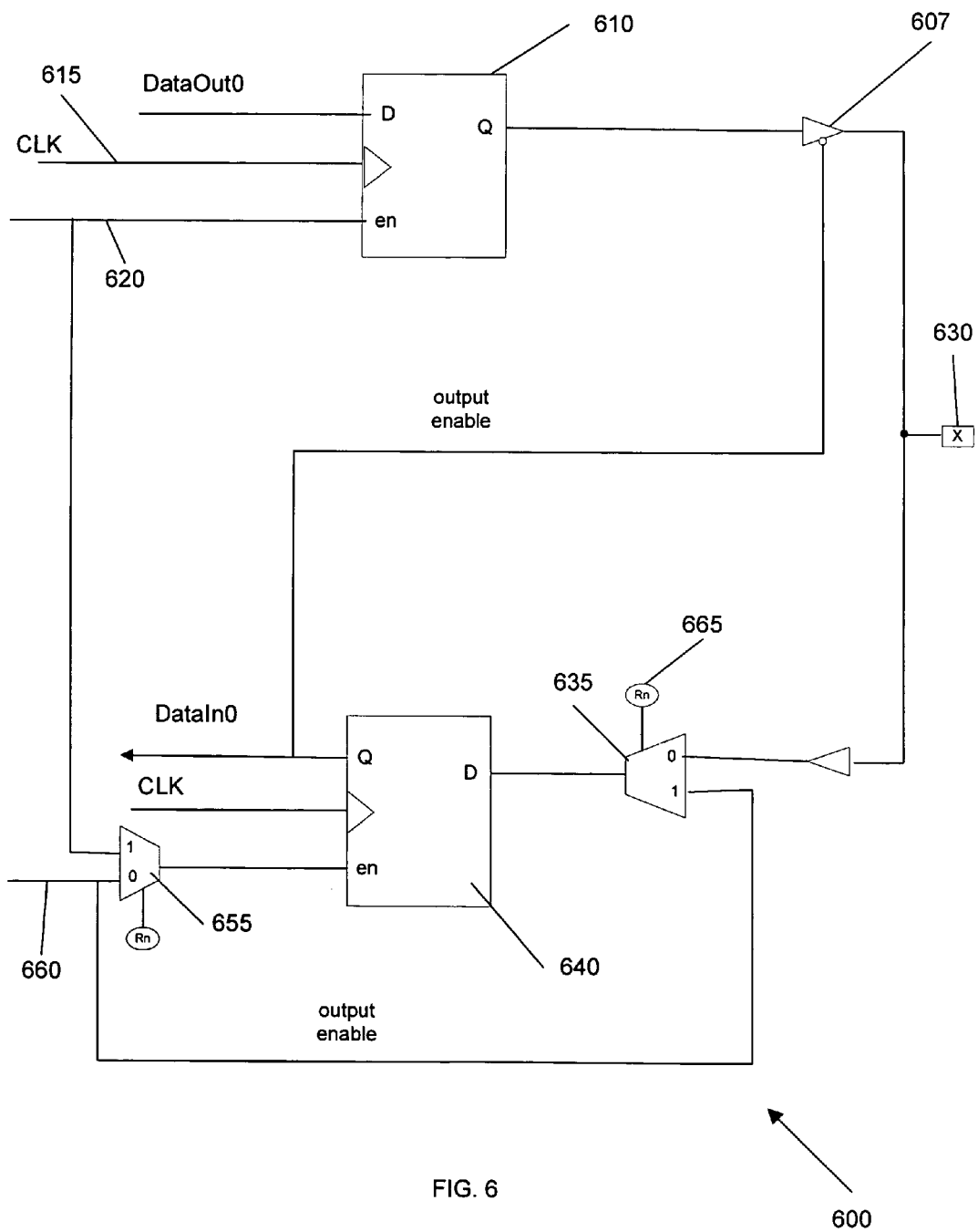
FIG. 6 illustrates a schematic of an input/output cell including a register for use as an input register or for use as an output-enable register according to an embodiment of the present invention.

FIG. 6 is a schematic of an I/O cell 600 according to an embodiment of the present invention. I/O cell 600 provides the same I/O options as cell 500. As register 640 is capable of being used as an input and an output-enable register, I/O cell 600 uses less wires and one less register.

During a SDR output function, register 610 receives DataOut0, and clock and output clock enable signals on lines 615 and 620 respectively. Register 610 sends DataOut0 to buffer 607. The output-enable signal is sent along line 660 to selection circuit 635, which chooses between output-enable and DataIn0 to send to register 640. During an output function, the output enable signal is chosen. Register 640 then sends the output-enable to buffer 607, which controls whether DataOut0 is sent to I/O pad 630 for output. During an output function, selection circuit 655 selects the output clock enable on line 620 to be sent to the enable input of register 640.

During an input function, selection circuit 635 chooses to send input data (DataIn0) from I/O pad 630 to register 640. Register 640 then send DataIn0 to the other parts of the circuit. In the input mode, selection circuit 655 chooses the input clock enable on line 660 to be sent to register 640. During output, line 660 carries output-enable, which does not pose any problems since the input clock enable is not needed. I/O cell 600 may be configured to run in an output or input mode by setting the memory value in CRAM bit 665. In one embodiment, CRAM bit 665 is shared by 655 and 635

The use of register 640 for the output-enable signal may be coupled with other embodiments of the present invention. For example, input register 640 could be used for the output-enable signal in DDR output. Additional input registers may also be used to provide more complex output-enable functions. The input registers may also provide 3-state control. Other embodiments of the invention may utilize input registers for other output functions, and utilize output registers for other input functions.

Figure 7:
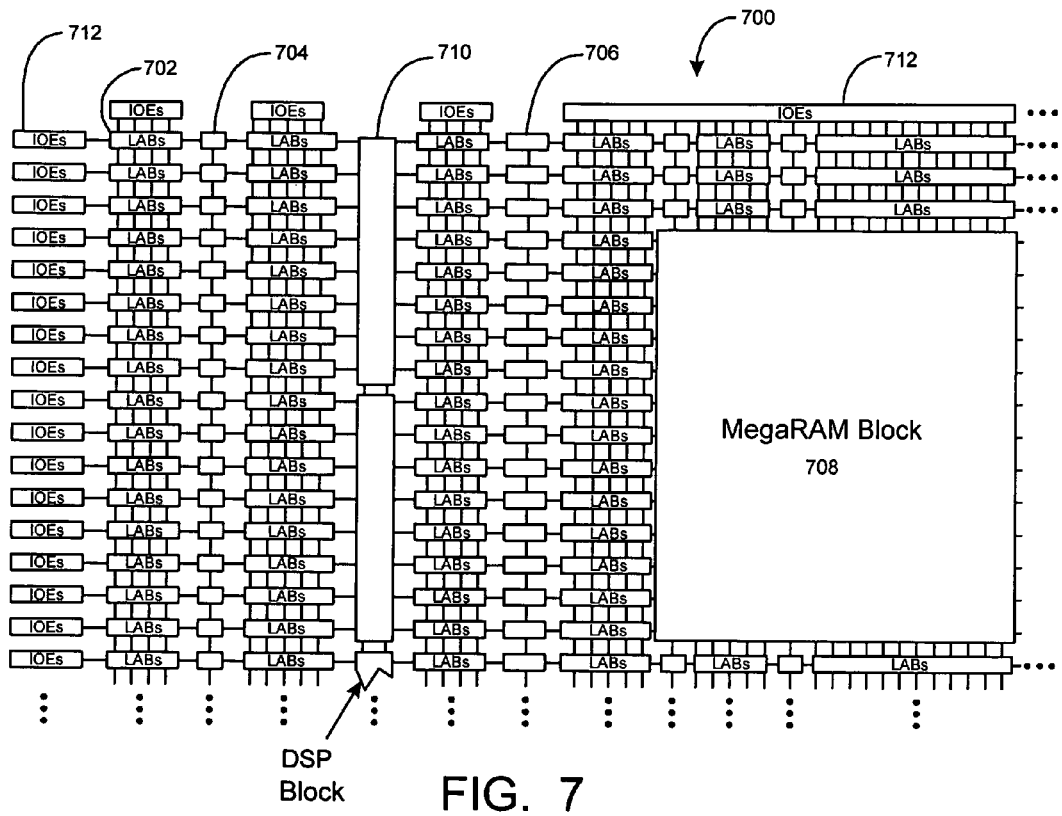
FIG. 7 is a simplified block diagram of a programmable logic device that does benefit by incorporating embodiments of the present invention.

FIG. 7 is a simplified partial block diagram of an exemplary high-density programmable logic device 700 wherein techniques according to the present invention can be utilized. PLD 700 includes a two-dimensional array of programmable logic array blocks (or LABs) 702 that are interconnected by a network of column and row interconnections of varying length and speed. LABs 702 include multiple (e.g., 10) logic elements (or LEs), an LE being a small unit of logic that provides for efficient implementation of user defined logic functions.

PLD 700 also includes a distributed memory structure including RAM blocks of varying sizes provided throughout the array. The RAM blocks include, for example, 512 bit blocks 704, 4K blocks 706 and an M-Block 708 providing 512K bits of RAM. These memory blocks may also include shift registers and FIFO buffers. PLD 700 further includes digital signal processing (DSP) blocks 710 that can implement, for example, multipliers with add or subtract features.

It is to be understood that PLD 700 is described herein for illustrative purposes only and that the present invention can be implemented in many different types of PLDs, FPGAs, and the other types of digital integrated circuits.

Figure 8:
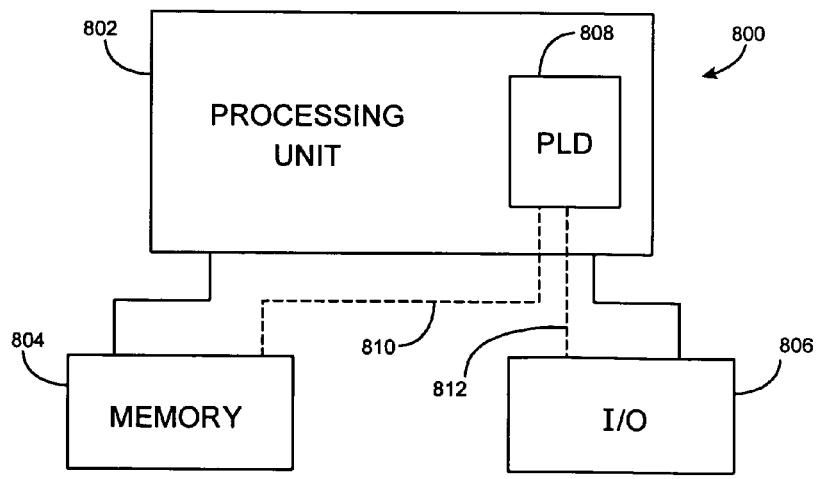
FIG. 8 is a block diagram of an electronic system that does benefit by incorporating embodiments of the present invention.

While PLDs of the type shown in FIG. 7 provide many of the resources required to implement system level solutions, the present invention can also benefit systems wherein a PLD is one of several components. FIG. 8 shows a block diagram of an exemplary digital system 800, within which the present invention may be embodied. System 800 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 800 may be provided on a single board, on multiple boards, or within multiple enclosures.

System 800 includes a processing unit 802, a memory unit 804 and an I/O unit 806 interconnected together by one or more buses. According to this exemplary embodiment, a programmable logic device (PLD) 808 is embedded in processing unit 802. PLD 808 may serve many different purposes within the system in FIG. 8. PLD 808 can, for example, be a logical building block of processing unit 802, supporting its internal and external operations. PLD 808 is programmed to implement the logical functions necessary to carry on its particular role in system operation. PLD 808 may be specially coupled to memory 804 through connection 810 and to I/O unit 806 through connection 812.

Processing unit 802 may direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 808 can control the logical operations of the system. In an embodiment, PLD 808 acts as a reconfigurable processor, which can be reprogrammed as needed to handle a particular computing task. Alternately, programmable logic device 808 may itself include an embedded microprocessor. Memory unit 804 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit, comprising:
a first timing circuit;
a first selection circuit having an output coupled with an input of the first timing circuit, wherein the first selection circuit receives a first input data signal and a first output data signal, wherein during an input function the first selection circuit sends the first input data signal to the first timing circuit and during an output function the first selection circuit sends the first output data signal to the first timing circuit;
a second selection circuit having an output coupled with the first timing circuit, wherein the second selection circuit is coupled with a first signal line and a clock enable line capable of carrying a first clock enable signal, wherein the first signal line is capable of carrying a data signal or a second clock enable signal; and
a second timing circuit,
wherein the first and second timing circuits are capable of being used together to perform at least one multiple data-rate input or output function.

2. An integrated circuit, comprising:
a first timing circuit;
a first selection circuit having an output coupled with an input of the first timing circuit, wherein the first selection circuit receives a first input data signal and a first output data signal, wherein during an input function the first selection circuit sends the first input data signal to the first timing circuit and during an output function the first selection circuit sends the first output data signal to the first timing circuit;
a second timing circuit, wherein the first and second timing circuits are capable of being used together to perform at least one multiple data-rate input or output function;
a second selection circuit coupled with an output of the first timing circuit and coupled with an output of the second timing circuit, wherein the first and second timing circuits are capable of being used together to perform at least one multiple data-rate output function; and
a third selection circuit having an output coupled with an input of the second timing circuit, wherein the selection circuit receives a second input data signal and a second output data signal, wherein during an input function the third selection circuit sends the second input data signal to the second timing circuit and during an output function the third selection circuit sends the second output data signal to the second timing circuit,
wherein the first and second timing circuit are capable of being used together for a multiple data-rate input.

3. The integrated circuit of claim 2, further comprising a control signal line coupled with the first selection circuit, wherein the control signal determines whether the first timing circuit is used for input or output.

4. The integrated circuit of claim 3, wherein the control signal comprises a value stored in a memory element.

5. The integrated circuit of claim 2, further comprising a third timing circuit having an input or an output coupled with the first timing circuit.

6. The integrated circuit of claim 2, wherein the multiple data-rate is a double data-rate.

7. The integrated circuit of claim 2, wherein during a multiple data-rate input, further comprising:
a third timing circuit that receives the first input data signal from the first timing circuit; and
a fourth timing circuit that receives the second input data signal from the second timing circuit.

8. The integrated circuit of claim 2, wherein the first and second timing circuits are capable of being used for a multiple data-rate input and a multiple data-rate output.

9. The integrated circuit of claim 2, wherein the first timing circuit and the second timing circuit are registers.

10. A method of providing a multiple data-rate input or output function, the method comprising:
selecting with a first selection circuit a first data signal from a first input data signal and a first output data signal for sending to a first timing circuit;
receiving the first data signal at the first timing circuit;
outputting the first data signal from the first timing circuit;
outputting a second data signal from a second timing circuit;
utilizing the first and second data signals to produce at least one multiple data-rate input or output,
wherein the first data signal is the first output data signal
further comprising:
receiving the first data signal at a second selection circuit;
receiving the second data signal at the second selection circuit; and
selecting with the second selection circuit among the first data signal and second data signal for output;
selecting with a third selection circuit a third data signal from a second input data signal and a second output data signal for sending to the second timing circuit;
receiving the third data signal at the second timing circuit;
outputting the third data signal from the second timing circuit; and
outputting a fourth data signal from the first timing circuit, wherein the third and fourth data signals comprise a multiple data-rate input.

11. The method of claim 10, further comprising selecting with a second selection circuit an input clock enable signal or a output clock enable signal to send to a clock enable input of the first timing circuit.

12. The method of claim 10, further comprising:
outputting a third data signal from a third timing circuit to the first selection circuit, wherein the third data signal is the first input data signal or the first output data signal.

13. The method of claim 10, further comprising:
receiving the first data signal at a third timing circuit; and
outputting the first data signal from the third timing circuit.

14. A method of providing a multiple data-rate input or output function, comprising:
selecting with a first selection circuit a first data signal from a first input data signal and a first output data signal for sending to a first timing circuit;
receiving the first data signal at the first timing circuit;
outputting the first data signal from the first timing circuit;
outputting a second data signal from a second timing circuit;
utilizing the first and second data signals to produce at least one multiple data-rate input or output; and
sending the input data signal or the output data signal along a signal line that is coupled with an input of a second selection circuit, wherein an output of the second selection circuit is coupled with a clock enable input of the first timing circuit.

15. The method of claim 14, further comprising:
receiving a clock enable signal at an input of the second selection circuit; and
selecting with the second selection circuit to send the clock enable signal to the first timing circuit.

16. A method of providing a multiple data-rate input function, the method comprising:
selecting with a first selection circuit a first data signal from a first input data signal and a first output data signal for sending to a first timing circuit;
receiving the first data signal at the first timing circuit;
outputting the first data signal from the first timing circuit;
outputting a second data signal from a second timing circuit that receives a second input data signal;
utilizing the first and second data signals to produce at least one multiple data-rate input,
outputting a third data signal from a third timing circuit to the first selection circuit, wherein the third data signal is the first input data signal;
aligning, with the third timing circuit, the first input data signal with the second input data signal; and
aligning, with the first and second timing circuits, the first and second data signals.

17. An integrated circuit, comprising:
a first timing circuit;
a first selection circuit having an output coupled with an input of the first timing circuit, wherein the first selection circuit receives an input data signal and an output data signal and outputs one of the data signals to the first timing circuit;

a second timing circuit; and an output buffer comprising:

an output enable input coupled with an output of the first timing circuit; and a data input coupled with an output of the second timing circuit, wherein the output of the first timing circuit determines if the output of the second timing circuit will be output from the output buffer.

18. The integrated circuit of claim 17, further comprising:

a third timing circuit having an output coupled with the output circuit, wherein the second and the third timing circuits provide multiple data-rate output functionality.

19. An integrated circuit, comprising:

a first timing circuit;

a first selection circuit having an output coupled with an input of the first timing circuit, wherein the first selection circuit receives an input data signal and an output data signal and outputs one of the data signals to the first timing circuit;

a second timing circuit; and an output circuit coupled with an output of the first timing circuit and an output of the second timing circuit, a third timing circuit having an output coupled with the first timing circuit, wherein respective clock inputs of the second and third timing circuits receive a same clock signal, and wherein the data inputs of the second and third timing circuits are adapted to receive data signals, to be output successively from the output circuit, on a same clock edge.

20. The integrated circuit of claim 19, further comprising a second selection circuit having an output coupled with the first timing circuit, wherein the second selection circuit receives a clock signal and a delayed or inverted clock signal.

21. The integrated circuit of claim 19, wherein the output circuit is a second selection circuit that selects a signal from a set of signals comprising the output of the first timing circuit and the output of the second timing circuit for outputting.

\* \* \* \* \*

UNITED STATES PATENT AND TRADEMARK OFFICE
CERTIFICATE OF CORRECTION

PATENT NO. : 7,631,211 B1  Page 1 of 1
APPLICATION NO. : 11/476341
DATED : December 8, 2009
INVENTOR(S) : Kevin W. Mai It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 691 days.

Signed and Sealed this

Second Day of November, 2010

David J. Kappos
*Director of the United States Patent and Trademark Office*